(12) United States Patent
Nishii

(10) Patent No.: US 6,698,093 B2
(45) Date of Patent: Mar. 2, 2004

(54) METHOD OF MANUFACTURING CIRCUIT FORMING BOARD TO IMPROVE ADHESION OF A CIRCUIT TO THE CIRCUIT FORMING BOARD

(75) Inventor: Toshihiro Nishii, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 77 days.

(21) Appl. No.: 09/913,512

(22) PCT Filed: Dec. 13, 2000

(86) PCT No.: PCT/JP00/08804
§ 371 (c)(1),
(2), (4) Date: Nov. 28, 2001

(87) PCT Pub. No.: WO01/45477
PCT Pub. Date: Jun. 21, 2001

(65) Prior Publication Data
US 2002/0157862 A1 Oct. 31, 2002

(30) Foreign Application Priority Data
Dec. 15, 1999 (JP) ............................................ 11-355413

(51) Int. Cl.⁷ ................................................. H01K 3/10
(52) U.S. Cl. ............................. 29/852; 29/846; 427/97; 427/99; 174/264; 174/266
(58) Field of Search ...................... 29/846, 852; 427/97, 427/99; 174/264, 266

(56) References Cited

U.S. PATENT DOCUMENTS

| | | | |
|---|---|---|---|
| 5,888,627 A | | 3/1999 | Nakatani |
| 5,990,003 A | * | 11/1999 | Oda ............................ 438/637 |
| 6,240,636 B1 | * | 6/2001 | Asai et al. ..................... 29/852 |
| 6,378,201 B1 | * | 4/2002 | Tsukada et al. ............... 29/852 |
| 6,409,869 B1 | * | 6/2002 | Yamane et al. ............. 156/252 |
| 6,486,058 B1 | * | 11/2002 | Chun ........................... 438/637 |

FOREIGN PATENT DOCUMENTS

| | | |
|---|---|---|
| EP | 0723388 A1 | 7/1996 |
| JP | 62-19447 | 1/1987 |
| JP | 7-263828 | 10/1995 |
| JP | 11-121898 | 4/1999 |

* cited by examiner

Primary Examiner—Richard Chang
(74) Attorney, Agent, or Firm—McDermott, Will & Emery

(57) ABSTRACT

In order to improve the adhesion of a circuit to a circuit forming board, a separation film including a base film and a coating layer formed on the base film is joined to both the sides of the board. When a laser beam is applied to form a throughhole in the board, a unified portion of the board and the separation film is formed around the throughhole. An energy beam is applied to the whole or a part of the surface of a circuit formed at a circuit forming step to transfer a part of the separation film. Thus, a high density board where the circuit strongly adheres to the board can be realized in the manufacturing process of the circuit forming board.

20 Claims, 4 Drawing Sheets

(a)

(b)

(c)

(a)

(b)

(a)

(b)

(c)

(d)

METHOD OF MANUFACTURING CIRCUIT FORMING BOARD TO IMPROVE ADHESION OF A CIRCUIT TO THE CIRCUIT FORMING BOARD

TECHNICAL FIELD

The present invention relates to circuitry forming substrates used in a variety of electronic equipment and a manufacturing method of such circuitry forming substrates.

BACKGROUND ART

In recent years, as electronic equipment is seeing the ever-increasing level of size reduction and circuit density, a shift from conventional one surfaced substrates to two-surfaced substrates and multilayer substrates has been taking place in the area of circuitry forming substrates for mounting electronic components thereon, resulting in stepped up development of a high density circuitry forming substrate that enables the mounting of as many circuits as possible thereon.

With a high density circuitry forming substrate, in place of the conventional method of drilling to bore a hole (through hole) on a substrate, it is being considered to use energy beams such as a laser beam and the like, whereby machining at a higher speed and with a higher degree of definition is made possible. (cf. An article titled "Remarkable Recent Trend in Development of Build-up Multilayer PWB" authored by K. Takagi and appeared in "Surface Mounting Technology" published in January, 1997 from Nikkan Kogyo Shinbun of Japan)

However, with a high density substrate, as the line width and land size of circuits are reduced, the adhesion strength between the substrate and the circuits or the lands is naturally reduced. On the other hand, a high density substrate is usually used in such electronic devices as note PC's, portable telephones, PDA's and the like, and is liable to suffering from such mechanical stresses as caused by dropping, bending, impacting and the like occurring on the part of the electronic devices. As a result, the aforementioned reduction in adhesion strength of the high density substrate has been making a serious problem.

As the substrate material for a high density substrate, most of the time, a resin material is used and a high grade thermosetting resin is usually used from the view points of enhancement in the mechanical strength or heat resistance of the substrate. Although the properties of the substrate itself may be improved, however, the adhesion strength between the substrate and the circuits or the lands is not necessarily intensified when such mechanical stresses as an impact and the like imposed on the substrate are taken into consideration.

Conversely, when a material design and a material selection are carried out for the whole purpose of increasing the adhesion strength, the substrate properties except for the adhesion strength are often degraded. Therefore, it is actually difficult for the substrate material development to be performed so as to satisfy all the requirements involved with a high density substrate.

In addition, with a high density circuitry forming substrate, such connecting means as a conductive paste, a metal plating and the like are used in electrically connecting between layers of the substrate and, on the other hand, a spacing between through holes or non-through holes, which are generally referred to as via holes and formed on the substrate for interlayer connections, and a spacing between the via hole and the adjoining wiring are made smaller and smaller, resulting sometimes in such a serious problem of reliability for the circuitry forming substrate as caused by diffusion of a conductive paste and a plating solution for metal plating to the vicinity of via holes.

DISCLOSURE OF THE INVENTION

A manufacturing method of circuitry forming substrates of the present invention comprises the steps of:
forming through holes or non-through holes on a plate-like or sheet-like substrate formed of a single material or a plurality of materials by irradiating an energy beam on the substrate;
forming a connecting means in the through hole or non-through hole formed in the foregoing hole forming step to connect electrically between the upper surface and the lower surface of the substrate or between the outer layer and the inner layer of the substrate; and
forming a circuit on the surface of the substrate by disposing a conductive layer formed of a metal foil or a thin film on the surface and patterning the cconductive layer to a desired configuration,
in which the foregoing each respective step is performed independently or the elements of each respective step are intermingled with one another for the purpose of achieving what is intended for by the foregoing respective steps, and further comprises the steps of;
attaching by adhesion a film-like separation film on a surface or both surfaces of the substrate before the foregoing step of forming holes, and having part of the separation film transferred onto the substrate.

According to the present invention, a thin foreign material is disposed on the upper surface of a substrate by a transferring method, thereby allowing the adhesion strength of the substrate to be intensified owing to the effect of the foreign material and also enabling the use of an optimum material as the substrate material that makes it possible for the substrate to achieve desired overall characteristics. More specifically, a material, which is different from the substrate material and yet intensifies the adhesion strength of the substrate, is selectively transferred onto the surface of the substrate only in an area where a circuit or a land is disposed, thus allowing a high density and high reliability circuitry forming substrate to be realized without degrading the overall characteristics of the substrate.

In addition, the manufacturing method of circuitry forming substrates comprises the steps of:
forming through holes or non-through holes on a plate-like or sheet-like substrate formed of a single material or a plurality of materials by irradiating an energy beam on the substrate;
forming a connecting means in the through hole or non-through hole formed in the foregoing hole forming step to connect electrically between the upper surface and the lower surface of the substrate or between the outer layer and the inner layer of the substrate; and
forming a circuit on the surface of the substrate by disposing a conductive layer formed of a metal foil or a thin film on the surface and patterning the conductive layer to a desired configuration,
in which the foregoing each respective step is performed independently or the elements of each respective step are intermingled with one another for the purpose of achieving what is intended for by the foregoing respective steps, and further comprises the steps of;

attaching by adhesion a film-like separation film on a surface or both surfaces of the substrate before the foregoing step of forming holes, making the substrate and separation film almost in one-piece construction in the foregoing film attaching step, and then making the one-piece construction into a more solid one-piece structure intensely in the periphery of the through holes or non-through holes in the foregoing step of forming holes with a resulting prevention of the diffusion of connecting means to around the via holes. As a result, it is made possible for a high density and high reliability circuitry forming substrate to be realized.

A manufacturing method of circuitry forming substrates in a first aspect of the present invention comprises the steps of:

forming through holes or non-through holes on a plate-like or sheet-like substrate formed of a single material or a plurality of materials by irradiating an energy beam on the substrate;

forming a connecting means in the through hole or non-through hole formed in the foregoing hole forming step to connect electrically between the upper surface and the lower surface of the substrate or between the outer layer and the inner layer of the substrate; and forming a circuit on the surface of the substrate by disposing a conductive layer formed of a metal foil or a thin film on the surface and patterning the conductive layer to a desired configuration, in which the foregoing each respective step is performed independently or the elements of each respective step are intermingled with one another for the purpose of achieving what is intended for by the foregoing respective steps, and further comprises the steps of;

attaching by adhesion a film-like separation film on a surface or both surfaces of the substrate before the foregoing step of forming holes, and having part of the separation film transferred onto the substrate, thereby achieving the effects of increasing the adhesion strength between the substrate and the metal foil or the thin film from about 0.9 kg/cm of a traditionally normal value to about 1.2 kg/cm and the like in a strength test of peeling off a copper foil of 35 $\mu$m thick and 1 cm wide from the substrate.

A manufacturing method of circuitry forming substrates in a second aspect of the present invention comprises the steps of:

forming through holes or non-through holes on a plate-like or sheet-like substrate formed of a single material or a plurality of materials by irradiating an energy beam on the substrate;

forming a connecting means in the through hole or non-through hole formed in the foregoing step of forming holes to connect electrically between the upper surface and the lower surface of the substrate or between the outer layer and the inner layer of the substrate; and forming a circuit on the surface of the substrate by disposing a conductive layer formed of a metal foil or a thin film on the surface and patterning the conductive layer to a desired configuration, in which the foregoing each respective step is performed independently or the elements of each respective step are intermingled with one another for the purpose of achieving what is intended for by the foregoing respective steps, and further comprises the steps of;

attaching by adhesion a film-like separation film on a surface or both surfaces of the substrate before the foregoing step of forming holes, making the substrate and separation film almost in one-piece construction in the foregoing film attaching step and then making the one-piece construction into a more solid one-piece structure intensely in the periphery of the through holes or non-through holes in the foregoing step of forming holes with a resulting effect of preventing the diffusion of connecting means such as a conductive paste and the like used in the connecting means forming step to around the holes and the like.

A manufacturing method of circuitry forming substrates in a third aspect of the present invention comprises the steps of:

forming through holes or non-through holes on a plate-like or sheet-like substrate formed of a single material or a plurality of materials by irradiating an energy beam on the substrate;

forming a connecting means in the through hole or non-through hole formed in the foregoing hole forming step to connect electrically between the upper surface and the lower surface of the substrate or between the outer layer and the inner layer of the substrate; and forming a circuit on the surface of the substrate by disposing a conductive layer formed of a metal foil or a thin film on the surface and patterning the conductive layer to a desired configuration, in which the foregoing each respective step is performed independently or the elements of each respective step are intermingled with one another for the purpose of achieving what is intended for by the foregoing respective steps, and further comprises the steps of;

attaching by adhesion a film-like separation film on both surfaces of the substrate before the foregoing step of forming holes, and having the separation film near a perimeter or in a periphery of the through hole or non-through hole made to an elevated area which is formed of the separation film or mainly of the separation film with the substrate included and located at both sides or one side of an outside and a substrate side of the separation film by thermal effect in the hole forming step, so as to make a thickness of the elevated area larger at an energy beam incident side than at an energy beam releasing side resulting in such effects as exercising beneficial features of the elevated area at the side where the energy beam is incident and the like.

A manufacturing method of circuitry forming substrates in a fourth aspect of the present invention is the same as the manufacturing method of circuitry forming substrates in the first aspect of the present invention except for having part of the separation film transferred to near the periphery of the through hole or non-through hole formed in the hole forming step, resulting in such effects as intensifying the strength of adhesion between a circuit around a hole, i.e., a land and the substrate, and the like.

A manufacturing method of circuitry forming substrates in a fifth aspect of the present invention is the same as the manufacturing method of circuitry forming substrates in the first aspect of the present invention except for having part of the separation film transferred by irradiating an energy beam on the entire area or part of the area where a circuit formed in the circuit forming step, resulting in such effects as intensifying the strength of adhesion between the circuit and the substrate, and the like.

A manufacturing method of circuitry forming substrates in a sixth aspect of the present invention is the same as the manufacturing method of circuitry forming substrates in the first aspect or the second aspect except for using a porous base material that contains voids as the substrate material and also having a layer, which is free of voids or scarce of voids, formed of a material for separation films or a material prepared by mixing the substrate material and the material for separation films and disposed around the through hole or non-through hole formed in the hole forming step, thereby allowing the strength in adhesion between the land and the substrate to be intensified and also enabling the achievement of the effect of preventing a short circuit and the like caused by a conductive paste diffusing to around the holes.

A manufacturing method of circuitry forming substrates in a seventh aspect of the present invention is the same as the manufacturing method of circuitry forming substrates in the first aspect, the second aspect or the third aspect, in which the step of forming a connecting means further comprises a step of filling a conductive paste in the through holes or non-through holes that are formed in the step of forming holes, and then the separation film is peeled off from the substrate, a metal foil or a circuitry forming substrate for inner layer is disposed on one surface or both surfaces of the substrate, respectively, and a pressing force is applied thereto while heat being applied, thereby achieving the integration into a one-piece structure of the substrate and the metal foil or the substrate and the circuitry forming substrate for inner layer and realizing an electrical connection between the upper and lower surfaces or the outer and inner layers of the substrate by the use of a conductive paste with the step of forming circuitry with a patterning process applied to the metal foil following thereafter. Accordingly, there are provided such effects as maintaining a sufficient filling amount of the conductive paste and the like by making the swelling larger at the side of the surface thereof where the conductive paste is less liable to being taken away with the separation film when the separation film is peeled off from the substrate.

A manufacturing method of circuitry forming substrates in an eighth aspect of the present invention is the same as the manufacturing method of circuitry forming substrates in the first aspect, the second aspect or the third aspect, in which the separation film is peeled off from the substrate after the step of forming holes, a metal foil or a circuitry forming substrate for inner layer is disposed on one surface or both surfaces of the substrate, respectively, and a pressing force is applied thereto while heat being applied, thereby achieving the integration into a one-piece structure of the substrate and the metal foil or the substrate and the circuitry forming substrate for inner layer, and then an electrical connection between the upper and lower surfaces or the outer and inner layers of the substrate is realized by forming a thin film inside of the holes and entirely or partly on one surface or both surfaces of the substrate by means of a plating method, a deposition method or some other thin film forming methods with the step of the forming circuitry by applying a patterning process to the thin film following thereafter. Accordingly, there are provided such effects as maintaining a sufficient strength in adhesion between the plating or thin film and the substrate, preventing the infiltration of a plating solution and the like.

A manufacturing method of circuitry forming substrates in a ninth aspect of the present invention is the same as the manufacturing method of circuitry forming substrates in the first aspect, the second aspect or the third aspect, in which the separation film further comprises a base film with a single coating layer or a plurality of coating layers disposed on one surface or both surfaces thereof and the one coating layer or the plurality of coating layers are transferred onto, integrated with or made to form a swelling on the substrate by being taken from the separation film in the hole forming step and circuit forming step, resulting in such effects as making a selection of materials to be transferred onto the substrate in such a way that the strength of adhesion is intensified, providing freedom of choice against the numerous requirements regarding the machinability and the like in the step of forming holes, and the like.

A manufacturing method of circuitry forming substrates in a tenth aspect of the present invention is the same as the manufacturing method of circuitry forming substrates in the ninth aspect, in which the coating layer to be transferred onto the substrate from the separation film is formed of a thermoplastic resin or a thermoplastic material prepared by having a thermosetting resin mixed with a thermoplastic resin, resulting in such effects as intensifying the strength in adhesion between the circuit and the substrate and the like due to the flexibility realized by a thermoplastic resin.

A manufacturing method of circuitry forming substrates in an eleventh aspect of the present invention is the same as the manufacturing method of circuitry forming substrates in the ninth aspect, in which the coating layer to be transferred onto the substrate from the separation film is formed of a thermosetting resin or a thermoplastic resin mixed with a thermosetting resin having heat curing and heat resistance, resulting in such effects as enhancing the strength in adhesion and heat resistance between the circuit or land and the substrate, and the like because of the use of a thermosetting resin. For example, with a circuitry forming substrate produced according to the manufacturing method of circuitry forming substrates in the ninth aspect of the present invention by the use of a separation film prepared by applying about 1 $\mu$m thickness composite of 79 parts by weight of epoxy denatured polyurethane, 10 parts by weight of bisphenol A type epoxy resin and 10 parts by weight of novolak type phenol resin as a curing agent and 1 part by weight of imidazole as a curing accelerator, to both surfaces of a 20 $\mu$m thick base film mainly formed of polyethylene phthalate, and then dried and cured, the adhesion strength under a high temperature is improved to about 1.0 kg/cm in comparison with the normal adhesion strength of 0.5 kg/cm of a prior art circuitry forming substrate in a strength test of peeling off a copper foil measuring 1 cm in width and 35 $\mu$m in thickness from a substrate heated to 150° C. in temperature.

A manufacturing method of circuitry forming substrates in a twelfth aspect of the present invention is the same as the manufacturing method of circuitry forming substrates in the ninth aspect, in which the coating layer transferred to the substrate from the separation film is formed of a metallic thin film, resulting in such effects as preventing corrosion or migration of metallic materials used in the circuit or land, and the like.

A manufacturing method of circuitry forming substrates in a thirteenth aspect of the present invention is the same as the manufacturing method of circuitry forming substrates in the first aspect, the second aspect or the third aspect, except for having a surface roughening treatment applied to one surface or both surfaces of the metal foil, resulting in such effects as allowing the adhesion strength to be intensified more efficiently and the like because of the interaction between the asperities produced by the surface roughening treatment and the material transferred.

A manufacturing method of circuitry forming substrates in a fourteenth aspect of the present invention is the same as the manufacturing method of circuitry forming substrates in the thirteenth aspect except for making the average extent of the surface roughness produced by the surface roughening treatment larger than the thickness of part of the separation film transferred onto the substrate, resulting in such effects as intensifying both the static adhesion strength and the dynamic adhesion strength that is needed to withstand a mechanical shock encountered in a drop test, for example, and the like because the peaks of the roughened surface pierce through part of the transferred separation film to get to the substrate, thereby allowing the metal foil to be joined with both substrate and separation film and the respective features in physical property of the substrate material and separation film to be exploited.

A manufacturing method of circuitry forming substrates in a fifteenth aspect of the present invention is the same as the manufacturing method of circuitry forming substrates in the thirteenth aspect except for making the average extent of the surface roughness produced by the surface roughening treatment smaller than the thickness of part of the separation film transferred onto the substrate, resulting in such effects as allowing the material transferred to act more efficiently as a cushion and the like because there is no direct contact between the substrate and the metal foil and also to act as a protector and the like to shield the metal foil from the substrate in case a material corrosive to the metal foil is contained in the composition of the substrate material.

A manufacturing method of circuitry forming substrates in a sixteenth aspect of the present invention is the same as the manufacturing method of circuitry forming substrates in the first aspect, in the second aspect or in the third aspect except for using a laser beam as the energy beam for the step of forming holes, resulting in such effects as facilitating the control of energy for machining and the like so as to achieve the intended objectives such as transferring and the like efficiently.

A manufacturing method of circuitry forming substrates in a seventeenth aspect of the present invention is the same as the manufacturing method of circuitry forming substrates in the sixteenth aspect except for using a carbon dioxide laser beam as the energy beam for the step of forming holes, resulting in such effects as a reduction in cost of forming holes by laser beam machining, excellent machinability in forming holes on a resin material, and the like A manufacturing method of circuitry forming substrates in an eighteenth aspect of the present invention is the same as the manufacturing method of circuitry forming substrates in the sixteenth aspect,
in which the wavelength of the laser beam is shorter than 10 $\mu$m and longer than 9 $\mu$m, resulting in such effects as bringing benefits to transferring, forming of a one-piece structure or shaping of a suitable swelling, and the like.

A manufacturing method of circuitry forming substrates in a ninteenth aspect of the present invention is the same as the manufacturing method of circuitry forming substrates in the sixteenth aspect,
in which the laser beam is irradiated one time or a plurality of times in a pulse shape with the pulse energy for at least the first time of the laser beam irradiation exceeding 10 mJ, resulting in such effects as bringing benefits to transferring, forming of a one-piece structure or shaping of a suitable swelling, and the like.

A manufacturing method of circuitry forming substrates in a twentieth aspect of the present invention is the same as the manufacturing method of circuitry forming substrates in the first aspect, the second aspect or the third aspect,
in which a B-stage resin prepared by having a reinforced material impregnated with a thermosetting resin, i.e., what is called a prepreg or a film prepared by making a B-stage resin from a thermosetting resin without using a reinforced material is used as the substrate, resulting in such effects as facilitating the substrate material and separation film to be formed into a one-piece structure, and the like.

A manufacturing method of circuitry forming substrates in a twenty first aspect of the present invention is the same as the manufacturing method of circuitry forming substrates in the first aspect,
in which part of the separation film transferred onto the substrate is 3 $\mu$m or less in thickness, resulting in such effects as allowing a circuitry forming substrate to be manufactured without losing the properties of the substrate material and the like.

A manufacturing method of circuitry forming substrates in a twenty second aspect of the present invention is the same as the manufacturing method of circuitry forming substrates in the first aspect or the second aspect, in which any surface out of both surfaces of the substrate, where transferring of the separation film or forming of a layer free of voids is performed efficiently, is arranged to be located on the upper layer side of the circuitry forming substrate, resulting in such effects as making the transferring and forming of a one-piece structure contribute to working effectively on the upper most part of the substrate where the strength in adhesion between the circuit and the substrate is considered as important.

A circuitry forming substrate in a twenty third aspect of the present invention has a material structure,
in which the thermoplasticity of a place inside the substrate decreases stepwise as the distance of the place from the circuit or land formed on the upper surface of the substrate increases in the thickness direction of the substrate starting from immediately below the upper surface of the substrate, thereby allowing the substrate employing a thermosetting material as the main material thereof to achieve such an effect as realizing the required characteristics in stiffness, mechanical strength and the like while maintaining the adhesion strength of the circuit or land by providing the substrate immediately below the circuit or land with thermoplasticity, i.e., flexibility.

PREFERRED EMBODIMENTS FOR CARRYING OUT THE INVENTION

Figure 1:
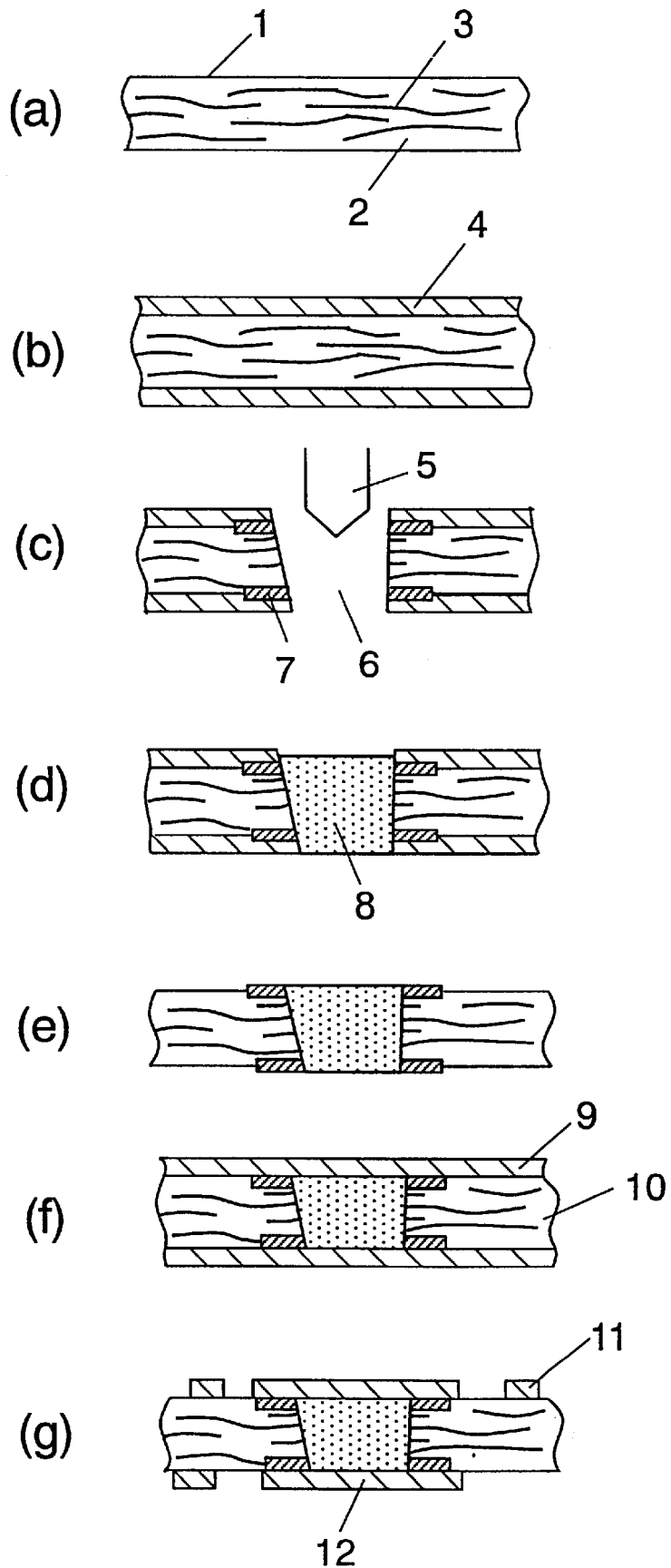
FIG. 1 shows cross-sectional views of the steps constituting a manufacturing method of circuitry forming substrates in a first exemplary embodiment of the present invention.
Figure 2:
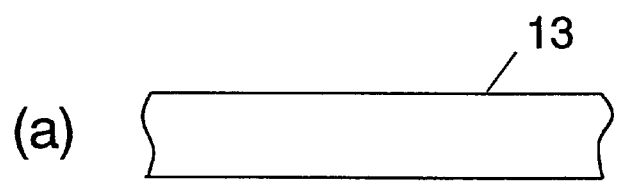
FIG. 2 shows cross-sectional views of the steps constituting a manufacturing method of circuitry forming substrates in a second exemplary embodiment of the present invention.
Figure 2:
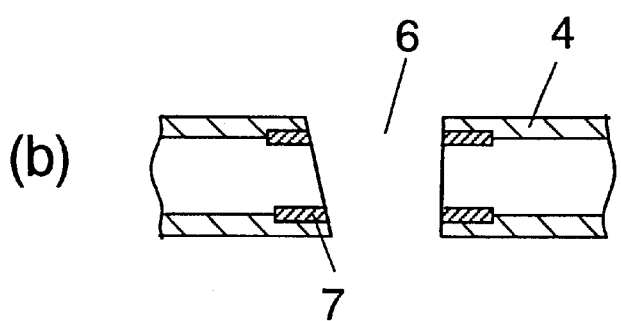
Figure 2:
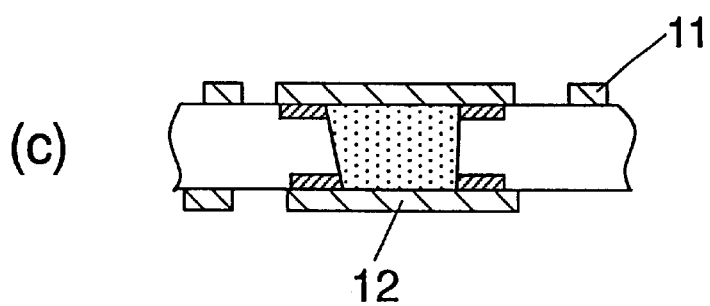

Next, a description is given to some of the exemplary carrying out embodiments of the present invention with reference to FIG. 1 to FIG. 4.

First Exemplary Embodiment

FIG. 1(a) to FIG. 1(g) show cross-sectional views of a circuitry forming substrate and the steps constituting a manufacturing method of the circuitry forming substrate in a first exemplary embodiment of the present invention.

As FIG. 1(a) shows, a substrate 1 is formed of a thermosetting resin 2 and glass fibers 3, thereby constituting a composite material. The thermosetting resin 2 is not completely cured but in the so-called B stage having a content that is not cured yet The substrate 1 is what is usually referred to as a prepreg.

As the thermosetting resin, there can be used epoxy resin, unsaturated polyester resin, phenol resin, polyimide resin, cyanate resin, cyanic acid ester resin, naphthalene resin, urea resin, amino base resin, alkyd resin, silicone resin, furan base resin, polyurethane resin, fluorocarbon polymer, polyphenylene ether, cyanate ester resin and the like singly, or in the form of a thermosetting resin composite prepared by mixing two kinds or more of the foregoing, or in the form of a thermosetting sub-resin composite denatuated with a thermoplastic resin. As needs require, a flame retardant and an inorganic filler are allowed to be used as additives.

As an example of the epoxy resin, there is provided a bisphenol type epoxy resin or a multifunctional epoxy resin and as the composites thereof such materials as bisphenol type epoxy resin-disyandiamide curing resin and the like are found. Alternatively, there are also such materials as glycidylamine type epoxy resin-disyandiamide curing resin and the like. More specifically, a mixture of 26 parts by weight of bromine epoxy resin, 48 parts by weight of 3 functional epoxy resin, 26 parts by weight of phenolnovolak resin as a curing agent and 0.25 parts by weight of 2-ethyl 4-methylimidazol as a curing accelerator (which is turned to varnish with 55 parts by weight of methylethylketone when impregnated in glass fibers) is used, for example.

Then, as FIG. 1(b) shows, a separation film 4 is provisionally attached by adhesion on both surfaces of the substrate 1, respectively, while a pressing force and heat being applied thereto. It is also possible to use ordinary facilities such as a laminator and the like.

The separation film 4 is allowed to be prepared by applying onto a base film mainly formed of polyethyleneterephthalate with such thermoplastic resins as polycarbonate base resin, polysulfone base resin, polyether sulfone base resin, polyacetal base resin, polyetherketone base resin, polyetherimide base resin, polyphenyl sulfide base resin, polyphenilene oxide base resin, polyurethane base resin, polyethylene base resin, epoxy-melamine resin, aminoalkyd base resin, acryl base resin and the like singly or in combination, or a thermosetting resin mixed with a thermoplastic resin.

More specifically, a coating material is prepared by using 15 parts by weight of Melan 27 (a melamine resin supplied from Hitachi Chemicals), 13 parts by weight of Melan 13 (a melamine resin supplied from Hitachi Chemicals), 3 parts by weight of Epicoat 1001 (an epoxy resin supplied from Hitachi Chemicals) and 1.8 parts by weight of Carbon Black #3050B (supplied from Mitsubishi Chemicals) as conductive powder with a solvent formed of 22 parts by weight of MEK, 22 parts by weight of IPA and 22 parts by weight of toluene dispersed uniformly therein and then by adding 0.005 parts by weight of paratoluene sulfonic acid as a curing catalyst through agitation. After applying the foregoing coating material on both surfaces of a 20 μm thick polyester film or on one of the surfaces thereof that is to be in contact with the substrate 1, the coating material is died to a thickness of 1.5 μm in an oven, thereby producing a resin coated film that makes the separation film involved with the present invention. The conductive powder is primarily intended for serving as an antistatic additive and is allowed to be omitted under certain circumstances.

Another coating material with a composition different from that of the foregoing coating material uses 35 parts by weight of B Clear (supplied from Kowa Paints) as an aminoalkyd base resin, 0.008 parts by weight of phosphoric acid as a curing catalyst and a solvent formed by mixing uniformly 20 parts by weight of MEK, 20 parts by weight of IPA and 20 parts by weight of toluene, and or a mixture of 40 parts by weight of bisphenol A type epoxy resin, 20 parts by weight of epoxy denaturated polyurethane resin, 19 parts by weight of novolak type phenol resin as a curing agent and 2 parts by weight of imidazol as a curing accelerator and the like are also allowed to be adopted.

Also, in order for the separation film to be enhanced in mold releasing ability and adjusted in adhesion to the substrate 1, a silicon mold release agent is sometimes applied thereon. More specifically, a mixture is prepared by the use of 5 parts by weight of KS-847H (supplied from Shinetsu Chemicals), 0.1 parts by weight of CAT-PL-50 (supplied from Shinetsu Chemicals) and a solvent formed of 50 parts by weight of toluene and 50 parts by weight of MEK to obtain a silicon mold release agent. This mold release agent is applied on one of the surfaces of the separation film, which is in contact with the substrate 1, and then dried in warm air and the like, thus obtaining a separation film, which is formed thereon with a silicon mold release film and involved with the present invention.

Next, a through hole 6 is formed by irradiating a laser 5 as FIG. 1(c) shows. At this time, a one-piece structured area 7 is formed between the substrate 1 and the separation film 4 in the periphery of the through hole 6 by the laser beam machining energy.

Thereafter, as FIG. 1(d) shows, a conductive paste 8 is filled in the through hole 6. As the method for filling the conductive paste 8 in the through hole 6, such methods as a squeegeeing method and the like are allowed to be used.

Then, the separation film 4 is peeled off from the substrate 1 as FIG. 1(e) shows. At that time, the one-piece structured area 7 is peeled off from the separation film 4 and remains on the substrate 1. When the separation film 4 is made a multilayer structure formed of a base film and a coating layer stacked on top of each other with respective materials selected appropriately, although this structure is not shown in the drawings, such a phenomenon as having separation between the base film and the coating layer taken place to leave the one-piece structured area 7 on the substrate 1 is allowed to occur efficiently. Accordingly, part of the separation film 4 can be transferred onto the substrate 1.

Next, as FIG. 1(f) shows, a copper foil 9 is disposed on both surfaces of the substrate 1, respectively, and a pressing force and heat are applied thereto by means of a heat press machine and the like, thereby obtaining a double-sided board 10.

Then, as FIG. 1(g) shows, a pattern is formed by etching on the copper foil 9 of each respective surface of the double-sided board 10 to form a circuit 11, thus finishing the production of a double-sided circuitry forming substrate.

Beneath a land 12 of the finished double-sided circuitry forming substrate, the one-piece structured area 7 transferred onto the substrate 1 is formed and cured together with the thermosetting resin 2 contained in the substrate 1. When a thermoplastic resin is used primarily as the material of the separation film 4 or as the material of the upper most layer to be transferred onto the substrate 1 in case where the separation film 4 is formed of a multilayered material, the resin immediately below the land 12 shows enhanced thermoplasticity and the degree of thermosetting ability increases in succession as the distance from the surface increases in the depth direction.

Since the scope of selection with respect to resin composition is restricted with the thermosetting resin 2 in consideration of the mechanical strength, moisture resistance and the like that are important for a circuitry forming substrate, it is not necessarily possible for the best material to be selected in terms of the adhesion strength of the land 12. However, according to the present exemplary embodiment, the most suitable material in terms of the adhesion strength can be disposed on a small area beneath the land 12 by transferring the material as such from the separation film 4. According to the finding of the inventor, a transferred layer measuring less than 3 $\mu$m in thickness delivers the effectiveness thereof sufficiently.

In addition, when the through hole 6 is formed by the laser 5, it is found possible for a one-piece structured area 7 to be formed in the areas where no through holes 6 exist by irradiating the laser 5 that provides machining energy large enough to allow the one-piece structured area 7 to be formed and yet not allow the separation film 4 and the substrate 1 to be damaged, thereby allowing the one-piece structured area 7 to be formed beneath the circuit 11 with a resulting intensified strength in adhesion between the circuit 11 and the substrate 1.

According to the structure as employed in the present Exemplary Embodiment featuring a thermoplastic resin, i.e., a resin provided with a little flexibility, disposed beneath the land 12, even if a circuitry forming substrate is put into a mode of receiving a stress large enough to peel off the land 12 by subjecting the double-sided circuitry forming substrate to mechanical stresses, by having the land 12 used as a land for mounting components and the like, the circuitry forming substrate is allowed to be produced so as to show enhanced reliability when compared with the case where no one-piece structured area 7 is provided.

Sometimes a roughening treatment is applied to the surface of a copper foil in order to intensify the adhesion strength of the copper foil and by adjusting on purpose the relationship between the average roughness produced on the copper foil surface and the thickness of the separation film transferred onto the substrate 1, the effects as described below are developed.

When the average magnitude of roughness of the surface subjected to the roughness treatment is larger than the thickness of part of the separation film 4 transferred onto the substrate 1, some projected tips of the roughened copper foil surface get to the substrate 1 piercing through the part of the transferred separation film 4, thereby having the metal foil brought into contact with both of the substrate 1 and the separation film 4. As a result, such an effect of intensifying both the static adhesion strength and the dynamic adhesion strength against a shock encountered at the time of a drop test can be developed due to the difference in physical properties between the substrate material and the separation film 4.

On the other hand, when the average magnitude of roughness of the surface subjected to the roughness treatment is smaller than the thickness of the part of the separation film 4 transferred onto the substrate material, the substrate 1 and the metal foil are not brought into contact with each other, thereby allowing the cushioning and the like of the transferred material to work efficiently and also allowing the effect of acting as a shield between the substrate 1 and the metal foil to be developed when a material corrosive to the metal foil is contained in the composition of the substrate material.

It is also possible for the coating layer transferred from the separation film to be made of a metal thin film, thereby allowing the metal thin film to develop such effects as preventing corrosion or migration of a metal used in circuits or lands from occurring, and the like.

Although a description is given in the foregoing with glass fibers 3 used as a reinforcement material for the substrate 1, it is also possible to use organic materials as exemplified by aramid fibers as the reinforcement material. In that case, the one-piece structured area 7 is allowed to form a composition containing the organic fibers in a melted state or in a state altered in properties. As a result, it is possible for the adhesion strength to be improved even further.

Second Exemplary Embodiment

FIG. 2(a) to FIG. 2(c) are cross-sectional views to show the manufacturing steps of a circuitry forming substrate in a second exemplary embodiment of the present invention.

A B stage film 13 as FIG. 2(a) shows is a material used as the substrate material in the present exemplary carrying out embodiment, which is prepared by stretching a thermosetting resin similar to the one used in the first exemplary carrying out embodiment to a film-like shape and is not yet completely cured and is in a state of, what is called, B stage.

In the same way as in the first exemplary carrying out embodiment, separation films 4 are put in place on both surfaces of the B stage film 13, respectively, and then a through hole 6 is formed thereon by means of a laser 5 (not shown in the drawing). At that time, a one-piece structured area 7 is formed around the through hole 6 by machining energy as FIG. 2(b) shows. It does not matter whether the one-piece structured area 7 is formed of a mixture of what is created by melting the B stage film 13 or by altering the properties of the B stage film 13 and what is created by melting the separation film 4 or by altering the properties of the separation film 4, or formed of what is created by melting the B stage film 13 or by altering the properties of the B stage film 13 and or what is created by melting the separation film 4 or by altering the properties of the separation film 4.

By controlling arbitrarily the machining energy and the materials for the separation film 4 and B stage film 13, the properties of the one-piece structured area 7 are made selectable. The one-piece structured area 7 is formed at a higher temperature than the temperature, at which the separation film 4 is attached by adhesion onto the B stage film 13, and within a short period of time, thereby allowing the one-piece structured area 7 to have few voids. As a result, the one-piece structured area 7 is made a kind of void free layer and when the through hole 6 is filled with a conductive paste or immersed in a plating solution in the later steps, the conductive paste and plating solution can be prevented from diffusing to the periphery of the through hole 6.

When a porous substrate material provided with voids is used as the material for the substrate 1 for the purposes of enhancing the reliability in connection and the like by compressing the substrate 1 in the thickness direction at a later heat pressing step to increase the extent of compression for the conductive paste, the degree of effectiveness of the one-piece structured area 7 is multiplied, thereby enabling the production of a circuitry forming substrate which shows no or a little infiltration of the conductive paste into voids inside the substrate 1.

There is a possibility that the properties similar to what the one-piece structured area 7 shows are allowed to be given to the boundary surface between the B stage film 13 and the separation film 4 by increasing the temperatures and pressure in the step of attaching by adhesion the separation film 4 onto the B stage film 13. However, the B stage film 13 loses the B stage state under such a high temperature condition and becomes hardened ending up with the C stage state or the volatile components contained in the material for the B stage film 13 are evaporated, resulting in the creation of unfavorable conditions such as foaming and the like.

Further, via the steps as described in the first exemplary embodiment, the B stage film 13 with the through hole 6 is formed thereon, thereby obtaining a double-sided circuitry forming substrate as FIG. 2(c) shows.

Third Exemplary Embodiment

Although the first and second exemplary embodiments deal with a double-sided circuitry forming substrate as an example, it is also possible to produce a multilayer circuitry forming substrate by using a double-sided circuitry forming substrate as a core material, disposing a prereg with a hole formed thereon and with a conductive paste filled in the hole according to the steps described in above or a B stage film and a copper foil on both surfaces of the core material, making the whole of the foregoing into a one-piece structure by applying heat and pressure thereto and further forming a pattern thereon.

Figure 3:
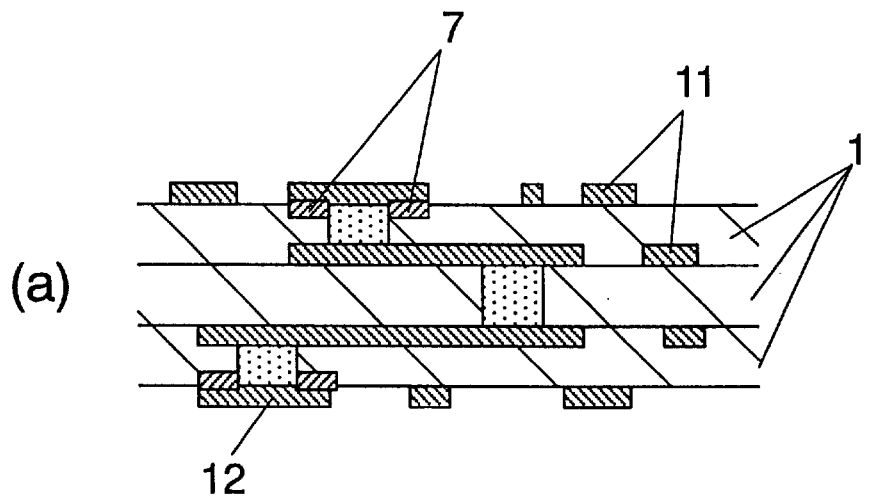
FIG. 3 shows circuitry forming substrates prepared according to a manufacturing method of circuitry forming substrates in a third exemplary embodiment of the present invention.
Figure 3:
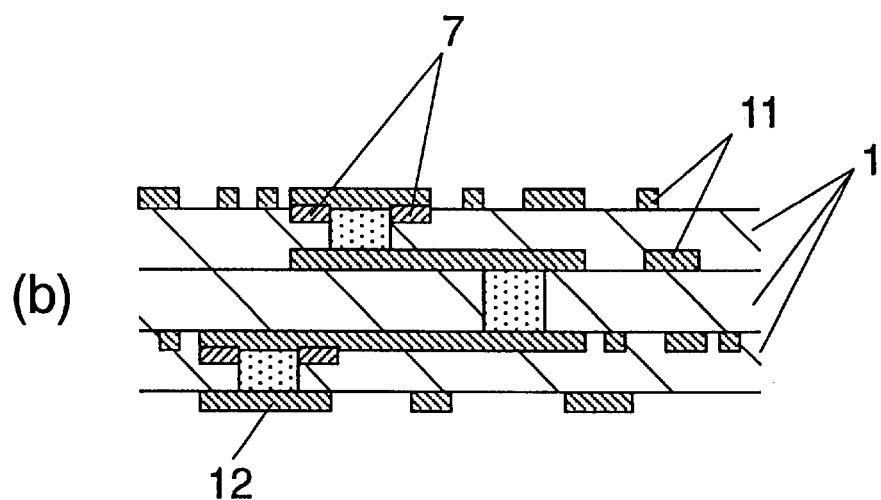
Figure 4:
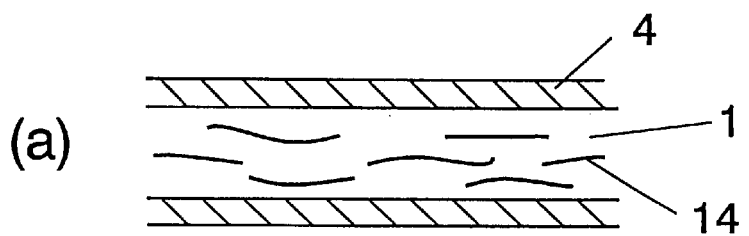
FIG. 4 shows cross-sectional views of the steps constituting a manufacturing method of circuitry forming substrates in a fourth exemplary embodiment of the present invention.
Figure 4:
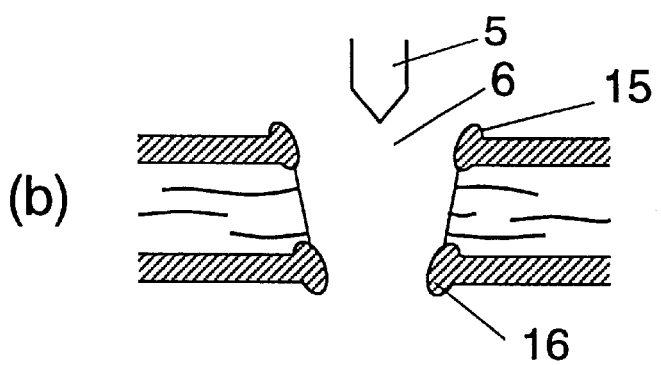
Figure 4:
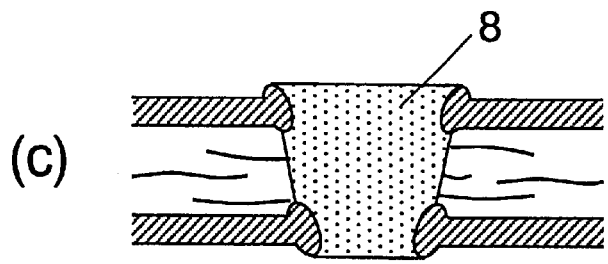
Figure 4:
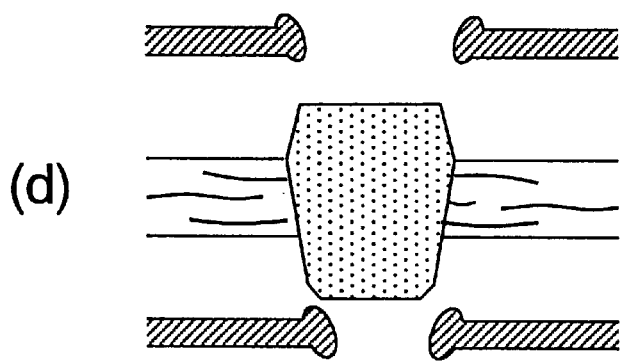

FIG. 3 shows cross-sectional views of circuitry forming substrates prepared according to a manufacturing method of circuitry forming substrates in a third exemplary embodiment of the present invention.

Depending on such conditions as machining energy, pulse width, wavelength and the like of the laser 5, a one-piece structured area 7 is allowed to be formed on both sides or one side of the substrate material 1 most appropriately in terms of efficiency. With the foregoing multilayer circuitry forming substrate, the adhesion strength of lands is enhanced by having the one-piece structured area 7 disposed on the upper surface of each respective substrate material 1 as FIG. 3(a) shows. Further, by having the one-piece structured area 7 disposed on the side where the density of the circuits 11 to be formed is large as FIG. 3(b) shows, thereby allowing such problems as insufficient insulation between circuits by diffusion of interlayer connecting means and the like to be prevented from occurring.

Although part of a separation film 4 is transferred to the periphery of a through hole 6 in the exemplary embodiments as described in above, it is also possible for the present invention to be adopted in manufacturing steps of a substrate using a non-through hole, represented by a so called build up substrate. By having the part of the separation film 4 transferred not only to the periphery of a hole but also underneath the circuit wiring such as a signal line and the like, such effects as intensifying the adhesion strength of the circuit wiring and the like are allowed to be gained.

Although a description is given to the case where a conductive paste is used as the means to perform interlayer connections in the foregoing first to third exemplary embodiments, it is also possible for the connecting means to employ such methods as a plating method, a metal deposition method and the like.

Fourth Exemplary Embodiment

FIG. 4(a) to FIG. 4(d) are cross-sectional views to show the manufacturing method of circuitry forming substrates in a fourth exemplary embodiment of the present invention.

A separation film 4 is provisionally attached by adhesion on both surfaces, respectively, of a substrate 1 prepared by having aramid nonwoven fabric impregnated with epoxy resin according to a laminate method and the like employing a heating roller as FIG. 4(a) shows. The separation film 4 is formed of a material produced by having a coating layer composed of a thermosetting resin disposed on both surfaces of a 20 $\mu$m thick base film comprising primarily polyethyleneterephthalate as a thermoplastic material. An example of the thermosetting resin coating layer is prepared by applying on 40 parts by weight of bisphenol A type epoxy resin with a composite of 20 parts by weight of of epoxy denaturated polyurethane resin, 19 parts by weight of novolak type phenol resin as a curing agent and 2 parts by weight of imidazol as a curing accelerator to a thickness of about 1 $\mu$m and then drying and curing the applied composite. However, the coating material as described in the first exemplary embodiment is also allowed to be used as the coating layer.

Then, a through hole 6 is formed by irradiating a $CO_2$ laser from above as FIG. 4(b) shows. At this time, due to the heat produced by the laser beam machining, a laser incident side elevated area 15 and a laser releasing side elevated area 16 are formed near the periphery of the through hole 6. Here, the incident side and releasing side are determined in reference to the direction, in which the laser 5 enters into the substrate 1. According the experiments conducted by the inventor, when a $CO_2$ laser of 10.6 $\mu$m in wavelength is used, the laser releasing side elevated area 16 is larger in thickness than the laser incident side elevated area 15.

As FIG. 4(c) shows, a conductive paste 8 is filled in the through hole 6 according to a squeegeeing method and the like. The conductive paste 8 is produced by dispersing copper particles into a binder formed mainly of thermosetting resin. Because of the sedimentation of copper particles and the like after the filling of the conductive paste 8, the viscosity of the conductive paste 8 after being filled in the through hole 6 is sometimes more increased near the laser releasing side elevated area 16 than near the laser incident side elevated area 15. Then, the separation film 4 is peeled off from the substrate 1 as FIG. 4(d) shows. At that time, as FIG. 4(d) shows, both of the separation film 4 and the conductive paste 8 are apart from each respective boundary surface between the separation film 4 and the conductive paste 8, thereby causing the conductive paste 8 to form a shape that protrudes from both surfaces of the substrate 1. This shape of the conductive paste 8 is preferable in consideration of retaining a sufficient amount of the conductive paste 8. When the conditions existing at the time of peeling off the separation film 4 are inappropriate, some portions of the conductive paste 8 are taken away from the substrate 1 together with the laser incident side elevated area 15 or the laser releasing side elevated area 16, thereby sometimes causing an adverse effect on the interlayer connections performed by the conductive paste 8 since the amount of the conductive paste 8 is reduced than the normal amount. The phenomenon of the conductive paste 8 partially taken away is attributed to numerous factors such as the viscosity of the conductive paste 8, thickness of the separation film 4, diameter of the through hole 6 and the like, and the thickness of the laser incident side elevated area 15 or the laser releasing side elevated area 16 also makes an important factor. As described in above, the viscosity of the conductive paste 8 near the laser releasing side elevated area 16 is usually high, thereby causing the conductive paste 8 to be more liable to be taken away. In addition, as FIG. 4(b) shows, when the through hole 6 is formed by laser beam machining, the hole diameter on the separation film 4 tends to become smaller at the laser releasing side 16 than at the laser incident side 15 and therefore the phenomenon of the conductive paste 8 taken away is likely to occur readily in the laser releasing side elevated area 16. The inventor has found out by experiment that the aforementioned $CO_2$ laser of 9.4 μm in wavelength allows the phenomenon of the conductive paste 8 taken away to be prevented from taking place. In other words, when the $CO_2$ laser of 10.6 μm in wavelength is used, the phenomenon of the conductive paste 8 taken away occurs often because of a relatively large thickness of the laser releasing side elevated area 16. When a both-sided circuitry forming substrate is produced in the same way as in the first exemplary embodiment of the present invention by the use of the substrate 1 after the foregoing step of peeling off the separation film 4, followed with the steps of disposing a copper foil on both surfaces of the substrate 1, respectively, and applying a pressing force thereto while heat being applied, the electrical resistance, which appears in connecting between the circuits formed on respective surfaces, varies extending over a wide range in measurement values. Conversely, when the energy amount of the laser 5 is reduced to decrease the thickness of the laser releasing side elevated area 16, the required magnitude in diameter for the through hole 6 has not been gained. However, the use of $CO_2$ laser of 9.4 μm in wavelength has not caused the phenomenon of the conductive paste 8 taken away to occur since the thickness of the laser releasing side elevated area 16 is small enough and yet the thickness of the laser incident side elevated area 15, which is less susceptible inherently to the phenomenon of the conductive paste 8 taken away, is relatively large, thereby contributing to the retention of a sufficient amount of the conductive paste 8. As a result, the resulting double-sided circuitry forming substrate shows a stabilized measurement value in electrical resistance of connection between the circuits formed on both surfaces of the substrate.

Although a description is given to an example of using 9.4 μm as the wavelength for a $CO_2$ laser in the present exemplary embodiment, it is possible to employ a plurality of wavelengths of 9.6 μm and the like, falling in the range of less than 10 μm and more than 9 μm, since the wavelength of the $CO_2$ laser is allowed to be selected by a method for adjusting the gas composition thereof and the like.

INDUSTRIAL APPLICABILITY

As described in above, the circuitry forming substrate and the manufacturing method thereof of the present invention feature that, in the hole forming step and the circuitry forming step for a circuitry forming substrate, part of the separation film is transferred onto the substrate, or the substrate and separation film are formed into a one-piece structure more intensely in the periphery of a through hole or a non-through hole, or an elevated area primarily formed of the separation film is provided, thereby intensifying the adhesion strength between the land or circuit and the substrate, or preventing the connecting means from diffusing to the periphery of a hole, or preventing the phenomenon of the conductive paste taken by the separation film from occurring. All in all, a circuitry forming substrate structured for a particularly high circuit density is allowed to achieve an enhancement in reliability.

What is claimed is:

1. A manufacturing method of circuitry forming substrates comprising the steps of:

forming through holes or non-through holes on a plate-like or sheet-like substrate formed of a single material or a plurality of materials by irradiating an energy beam thereon;

forming a connecting means in said through hole or non-through hole formed in said hole forming step to connect electrically between the upper surface and the lower surface of said substrate or between the outer layer and the inner layer of said substrate; and forming a circuit on the surface of said substrate by disposing a conductive layer formed of a metal foil or a thin film on said surface and patterning said conductive layer to a desired configuration, wherein said each respective step is performed independently or the elements of said respective step are intermingled with one another for the purpose of achieving what is intended for by said respective steps, and further comprising the steps of:

attaching by adhesion a film-like separation film on a surface or both surfaces of said substrate before said step of forming holes; and having part of said separation film transferred onto said substrate at all or part of positions thereof, where a circuit or a land is formed in said step of forming a circuit.

2. The manufacturing method of a circuitry forming substrate according to claim 1, wherein part of said separation film is transferred to near the periphery of the through hole or non-through hole formed in said step of forming holes.

3. The manufacturing method of a circuitry forming substrate according to claim 1, wherein part of said separation film is transferred by irradiating an energy beam on the entire area or part of the area where a circuit formed in said step of forming a circuit is located.

4. The manufacturing method of a circuitry forming substrate according to claim 1, wherein a porous base material containing voids is used as a substrate material, and a layer free of voids or a layer with few voids is formed of said separation film or a mixture of said substrate material and a separation film material in a periphery of a through hole or a non-through hole formed in said step of forming holes.

5. The manufacturing method of a circuitry forming substrate according to claim 1, wherein said step of forming a connecting means comprises a step of filling a conductive paste in a through hole or a non-through hole formed in said step of forming holes, then said separation film is peeled off from said substrate, a metal foil or a circuitry forming substrate for inner layer is disposed on one surface or both surfaces of said substrate, respectively, with a pressing force is applied thereto while heat being applied, thereby making said substrate and said metal foil or said substrate and said circuitry forming substrate for inner layer into a one-piece structure and realizing an electrical connection between an upper surface and a lower surface of said substrate or between an outer layer and an inner layer of said substrate by means of said conductive paste, and thereafter a step of forming a circuit by patterning said metal foil is put in place.

6. The manufacturing method of a circuitry forming substrate according to claim 1, wherein said separation film is peeled off from said substrate after said step of forming holes, a metal foil or a circuitry forming substrate for inner layer is disposed on one surface or both surfaces of said substrate, respectively, with a pressing force applied thereto while heat being applied, thereby making said substrate and said metal foil or said substrate and said circuitry forming substrate for inner layer into a one-piece structure, then a metal thin film is formed inside a hole of said substrate and on entirely or part of one surface or both surfaces of said substrate according to a metal plating method, a metal deposition method or some other thin film forming methods, thereby realizing an electrical connection between an upper surface and a lower surface of said substrate or between an outer layer and an inner layer of said substrate, and thereafter a desired circuit is formed by patterning said metal thin film.

7. The manufacturing method of a circuitry forming substrate according to claim 1, wherein a separation film is formed of a base film material with a single layer of a coating layer or a plurality of coating layers disposed on one surface or both surfaces of said base film material, respectively, and one layer of said coating layer or a plurality of said coating layers are transferred from said separation film to said substrate, made to form a one-piece structure with said substrate or made to form an elevated area.

8. The manufacturing method of a circuitry forming substrate according to claim 7, wherein a coating layer transferred from said separation film to said substrate is formed of a thermoplastic resin or a thermosetting resin mixed with a thermoplastic resin, thereby providing said coating layer with a thermoplastic property.

9. The manufacturing method of a circuitry forming substrate according to claim 7, wherein a coating layer transferred from said separation film to said substrate is formed of a thermosetting resin or a thermoplastic resin mixed with a thermosetting resin, thereby providing said coating layer with a thermosetting property and heat resistance.

10. The manufacturing method of a circuitry forming substrate according to claim 7, wherein a coating layer transferred from said separation film to said substrate is formed of a metal thin film.

11. The manufacturing method of a circuitry forming substrate according to claim 1, wherein a metal foil is applied with a surface roughening treatment on one surface or both surfaces thereof.

12. The manufacturing method of a circuitry forming substrate according to claim 11, wherein an average magnitude of roughness of a surface applied with a roughening treatment is larger than a thickness of part of said separation film transferred onto said substrate material.

13. The manufacturing method of a circuitry forming substrate according to claim 11, wherein an average magnitude of roughness of a surface applied with a roughening treatment is smaller than a thickness of part of said separation film transferred onto said substrate material.

14. The manufacturing method of a circuitry forming substrate according to claim 1, wherein a laser is used as an energy beam for use in said step of forming holes.

15. The manufacturing method of a circuitry forming substrate according to claim 1, wherein a $CO_2$ laser is used as an energy beam for use in said step of forming holes.

16. The manufacturing method of a circuitry forming substrate according to claim 14, wherein a wavelength of said laser is shorter than 10 μm and longer then 9 μm.

17. The manufacturing method of a circuitry forming substrate according to claim 14, wherein laser energy is irradiated in a pulse shape one time or a plurality of times, and said laser energy irradiated in a pulse shape is 10 m J or more for at least a first one time out of said one time or said plurality of times of irradiation.

18. The manufacturing method of a circuitry forming substrate according to claim 1, wherein as a substrate material is used a so called prereg in B stage prepared by having a reinforced material impregnated with a thermosetting resin, or a film formed of a thermosetting resin in B stage without using a reinforced material.

19. The manufacturing method of a circuitry forming substrate according to claim 1, wherein part of a separation film transferred onto said substrate measures 3 μm or less in thickness.

20. The manufacturing method of a circuitry forming substrate according to claim 1, wherein a surface out of both surfaces of said substrate where a separation film is transferred or a layer free of voids is formed efficiently is arranged so as to be located on an upper layer side of said circuitry forming substrate.

\* \* \* \* \*